United States Patent
Boyd et al.

(10) Patent No.: US 11,905,165 B2
(45) Date of Patent: Feb. 20, 2024

(54) SYSTEM AND METHOD OF CONTINUOUS, VIBRATION-LESS, AND BI-DIRECTIONAL MEMS MIRROR MOTION VIA PERIODIC DRIVING FORCE FOR RAPID DATA ACQUISITION

(71) Applicants: O-Net Technologies (Group) Ltd., Shenzhen (CN); ITF Technologies Inc., Saint-Laurent (CA)

(72) Inventors: Kevin Boyd, Saint-Laurent (CA); Zuowen Jiang, Saint-Laurent (CA); Yun Ren, Saint-Laurent (CA); Feng Tian, Saint-Laurent (CA)

(73) Assignees: O-NET TECHNOLOGIES (GROUP) LTD., Shenzhen (CN); ITF TECHNOLOGIES INC., Saint-Laurent (CA)

( * ) Notice: Subject to any disclaimer, the term of this patent is extended or adjusted under 35 U.S.C. 154(b) by 536 days.

(21) Appl. No.: 17/098,527

(22) Filed: Nov. 16, 2020

(65) Prior Publication Data

US 2022/0098028 A1    Mar. 31, 2022

Related U.S. Application Data

(60) Provisional application No. 63/085,289, filed on Sep. 30, 2020.

(51) Int. Cl.
*G02B 26/08* (2006.01)
*B81B 3/00* (2006.01)
*G02B 6/35* (2006.01)

(52) U.S. Cl.
CPC .......... *B81B 3/0045* (2013.01); *G02B 6/3584* (2013.01); *G02B 26/0841* (2013.01); *B81B 2201/047* (2013.01)

(58) Field of Classification Search
CPC ........... B81B 3/0045; B81B 2201/047; G02B 6/3584; G02B 26/0841
See application file for complete search history.

(56) References Cited

U.S. PATENT DOCUMENTS

2010/0067096 A1* 3/2010 Ichikawa ........... G02B 26/0841
359/238

FOREIGN PATENT DOCUMENTS

WO     WO20150135445 A1    9/2015

* cited by examiner

*Primary Examiner* — Euncha P Cherry
(74) *Attorney, Agent, or Firm* — Brouillette Legal Inc.; Robert Brouillette

(57) ABSTRACT

The present invention relates to a MEMS device and related methods comprising a mirror for the measuring of light frequency. The MEMS mirror may rotate around a pivot point and is driven by a periodic force for continuous bi-directional motion without transient vibrations. The periodic force may further comprise transient functions comprising special waveforms when at the turn-around point of the bi-directional rotation.

18 Claims, 6 Drawing Sheets

SYSTEM AND METHOD OF CONTINUOUS, VIBRATION-LESS, AND BI-DIRECTIONAL MEMS MIRROR MOTION VIA PERIODIC DRIVING FORCE FOR RAPID DATA ACQUISITION

CROSS-REFERENCE TO RELATED APPLICATIONS

There are no cross-related applications.

FIELD OF THE INVENTION

The present invention generally relates to the field of microelectromechanical systems (MEMS) sensor technology.

BACKGROUND OF THE INVENTION

When the position of a MEMS device is changed abruptly, it vibrates as a damped harmonic oscillator due to excitation of the MEMS mechanical resonance. These vibrations are often detrimental to sensor performance and, in order to obtain an accurate reading from the sensor, the vibrations must first settle to an acceptable level. This settling time degrades sensor performance by increasing the time required to make an accurate measurement. This problem becomes significant when the MEMS device is scanned through a range of positions within a short period of time. Vibrations can be avoided by scanning the MEMS device sufficiently slowly so as not to excite the mechanical resonances (see PCT WO2015135445A1 "Device and method for micro-electro-mechanical-system photonic switch"), but this increases the time required to obtain measurements. There is thus a need for a method of controlling a MEMS mirror which may allow rapid scanning throughout a range of positions with negligible vibration.

SUMMARY OF THE INVENTION

The aforesaid and other objectives of the present invention are realized by generally providing a method for driving a MEMS device without unwanted vibrations. More specifically, a MEMS mirror is driven with a periodic voltage within a range of 100 V that translates into periodic motion by the mirror. The motion is induced via the piezoelectric effect in which an applied electrical potential induces mechanical movement.

The MEMS mirror itself can be modelled as a damped harmonic oscillator. When a harmonic oscillator is driven by periodic force, the resultant motion is comprised of two components: a transient component that decays away over time, and a periodic component with the same frequency as the driving force. The transient component arises due to mechanical resonances that are excited when a new force is applied to the system. This transient component eventually decays away, leaving only periodic motion that follows the periodic driving force. It is only when an abrupt change occurs (ex. When the mirror is started from a rest position or the mathematical form of the force becomes non-periodic) that a transient will be excited. As long as the periodic force remains the same (i.e. the mathematical function describing the periodic force is unchanged), the resonant vibrations will not be excited again. Once the mirror motion becomes purely periodic, measurements may be taken over a range of positions of the mirror spanning the amplitude of said periodic component.

It may be appreciated that the waiting time required to take specific measurement once a periodic motion is acquired is significantly reduced compared to when vibrations are present. This vibration-free movement allows measurements to be taken over a range of mirror positions without waiting for mirror to settle. This permits faster acquisition of data.

In a first embodiment, a system for driving and measuring light frequency from a MEMS mirror is provided, the system comprising a MEMS mirror comprising a reflective surface pivotable around an axis; a driving mean adapted to cause the MEMS mirror to pivot; light reflected on the reflective surface of the MEMS mirror; and a detector for detecting the light reflected on the MEMS mirror; wherein the driving mean pivots the MEMS mirror as a function of a received driving voltage. The driving mean of the system may further comprise two plates having electrodes, wherein the plates are connected to the MEMS mirror via hinges. The driving voltage of the system may have a periodic component. The periodic component may be sinusoidal or may be a superposition of sinusoidal curves at different frequencies.

In yet another embodiment of the invention, a method to measure light reflected from a moving MEMS mirror is provided, the method comprising the steps of: reflecting light on a reflective surface of the MEMS mirror; applying a periodic force to the MEMS mirror; applying dummy operation cycles until transient vibration decays to zero; and measuring the frequency of the light with a detector. In other aspects of the invention, the applied periodic force is sinusoidal or is a superposition of sinusoids. In yet another aspect of the invention, the MEMS mirror is moving in a bi-directional motion or is continuously moving in a bi-directional motion.

In another embodiment of the invention, the periodic force of the method is a specialized waveform based on MEMS calibration data. In other aspects of the invention, the MEMS calibration data is a function of the periodic force frequency relative to the MEMS mirror position. In yet another aspect of the invention, the specialized waveform comprises a linear transfer function for driving the MEMS mirror. The periodic force may further comprise transition functions at top and bottom regions of the specialized waveform. In a further aspect of the invention, said transition functions are any one of parabolic, polynomial, logarithmic and exponential functions.

In a further embodiment of the invention, a method to measure light reflected from a moving MEMS mirror is provided, the method comprising the steps of: reflecting light on the MEMS mirror; applying a sinusoidal periodic force to the MEMS mirror to move said MEMS mirror in a continuous bi-directional motion around a pivot point, the sinusoidal periodic force being a specialized waveform comprising transition functions at the top and bottom regions of said specialized waveform; applying dummy operation cycles until transient vibration decays to zero; and measuring the frequency of the light with a detector. In yet another aspect of the invention, the specialized waveform is based on MEMS calibration data that is a function of the frequency relative to the MEMS mirror position. The specialized waveform may further ensure a linear transfer function for driving the MEMS mirror, the linear transfer function which may be any one of parabolic, polynomial, logarithmic or exponential functions.

The features of the present invention which are believed to be novel are set forth with particularity in the appended claims.

BRIEF DESCRIPTION OF THE DRAWINGS

The above and other objects, features and advantages of the invention will become more readily apparent from the following description, reference being made to the accompanying drawings in which.

DETAILED DESCRIPTION OF THE PREFERRED EMBODIMENT

A novel method of driving a MEMS mirror will be described hereinafter. Although the invention is described in terms of specific illustrative embodiment(s), it is to be understood that the embodiment(s) described herein are by way of example only and that the scope of the invention is not intended to be limited thereby.

Figure 1:
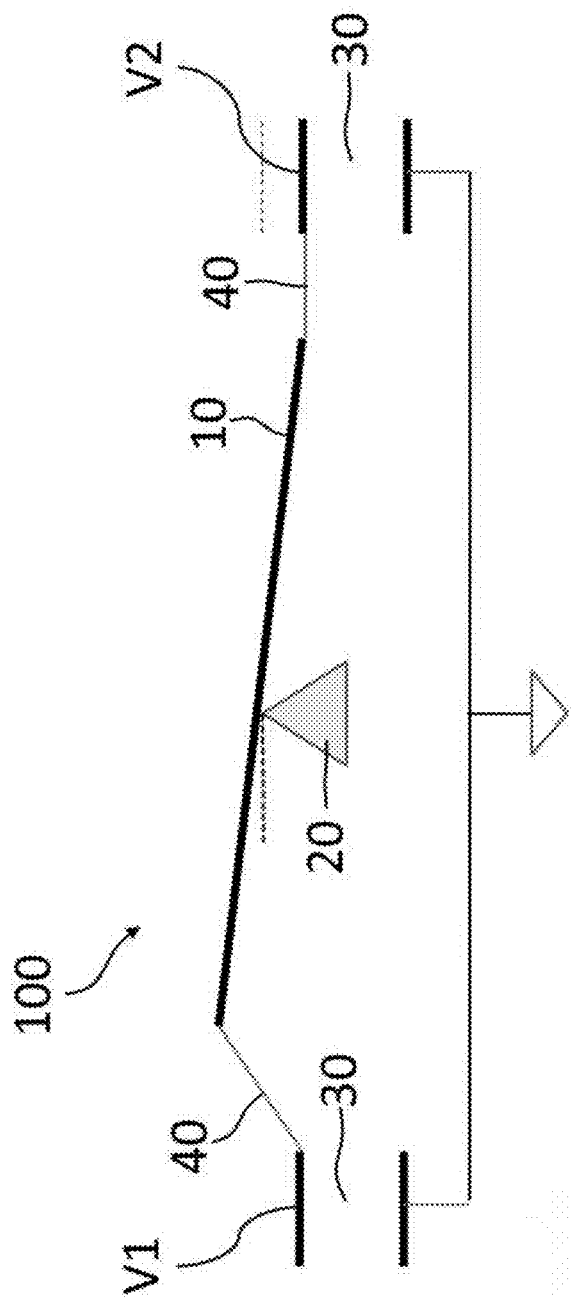
FIG. 1 is an illustration showing a diagram of a MEMS device with a mirror in accordance with an aspect of the invention.

FIG. 1 shows a diagram of an embodiment of the MEMS device 100. The MEMS device 100 may comprise a mirror 10, a pivot 20 and two charged plates 30. In the embodiment shown, the pivot 20 is located centrally under the MEMS mirror 10, but it may be appreciated that it may be located anywhere else under the mirror 10 in other embodiments. The two charged plates 30 comprise electrodes, not shown, allowing the production of electric force and are further connected to the MEMS mirror 10 by special hinges 40. In an embodiment, the charged plates 30 may be parallel to each other's and to the MEMS mirror 10 in a rest position. It is by applying a voltage to the electrodes that an electric force may be produced and further transferred to the MEMS mirror. Different voltages (V1, V2) may be applied on each charged plate. The voltage difference from one side of the mirror 10 to the other side may allow the rotation of said mirror 10 around the pivot 20. It may be appreciated that only one electrode may receive a voltage wherein the other is ground. By convention, we refer to voltages applied to the electrodes of the two charged plates 30, namely electrode 1 and electrode 2, as negative and positive respectively.

Figure 2:
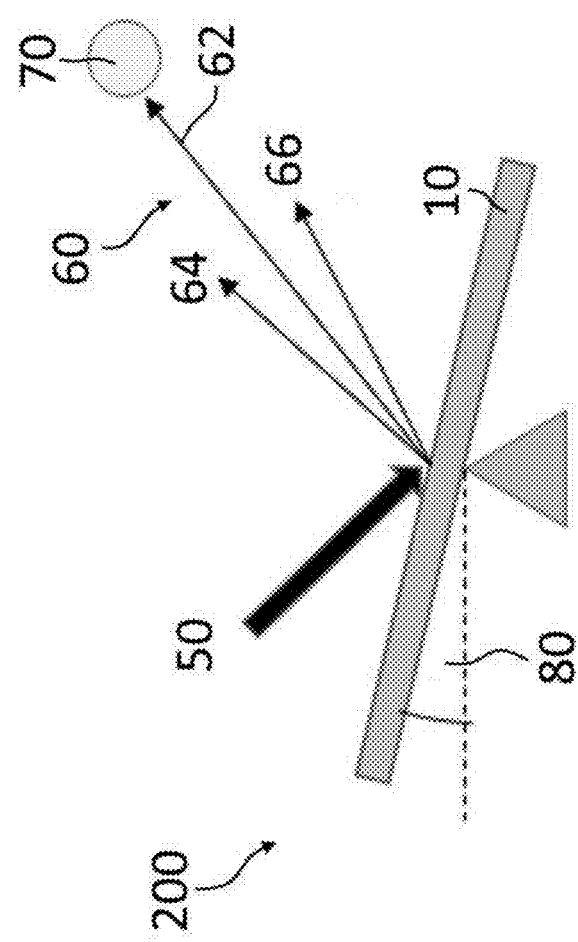
FIG. 2 is an illustration showing a diagram of an optical spectrometer using a MEMS mirror in accordance with an aspect of the invention.

FIG. 2 shows a diagram of an embodiment of an optical spectrometer based on a MEMS mirror device 200. Light 50 that has been spatially separated by a diffraction grating, not shown, is incident upon a MEMS mirror 10, and the reflected light 60 is collected by an optical detector 70 (photodiode or thermopile). Since the light has initially been spatially separated, only a narrow frequency band 62 may be received by the detector wherein other bands (64, 66) may not be received. As such, the angle of the mirror θ 80 determines which frequency is detected and so by scanning the mirror position, an optical frequency spectrum may be mapped out. Any optical spectrum that may be sufficiently spatially separated by a diffraction grating can be measured by the MEMS mirror device 200. The mirror position is directly related to the applied voltage, therefore the mirror position may be determined by scanning the drive voltage applied to said mirror 10.

The MEMS device 200 is actuated via the piezoelectric effect: a voltage applied to the MEMS electrode leads to a mechanical deformation that translates into an angular deflection of a mirror mounted to the MEMS device. When a voltage is applied to the MEMS mirror, it is deflected from angle $\theta_0$ to $\theta_0+\Delta\theta$. If a sinusoidal driving voltage is applied to the mirror the change in angle over time is given by:

$$\Delta\theta(t) = e^{-\gamma t}[A_{1h}\sin(\omega' t + \phi_{1h}) + A_{2h}\sin(\omega' t + \phi_{2h})] + A_1\cos(\omega t - \phi) + A_2$$

where A factors are amplitude constants, $\phi$ factors are phase constants relative to the driving force, $\omega$ is the angular frequency of the driving force, and $\gamma$ is a damping constant.

The first term of the equation represents the transient response of the mirror 10 to the driving force. This term is where the unwanted vibrational motion of the mirror 10 originates. The second term represents the periodic component of the mirror. After the transient component decays away, the angular deflection of the mirror is:

$$\Delta\theta(t) = A_1\cos(\omega t - \phi) + A_2$$

This equation shows that the motion of the MEMS mirror 10, in response to a sinusoidal driving force, becomes purely periodic after an initial transient. This purely periodic motion means that the mirror 10 can be swept through a range of angles rapidly, without unwanted vibrations. Although this analysis is specific to the case of a driving force that is sinusoidal, it can be extrapolated to any periodic driving force by the principle of Fourier superposition. That is, any periodic driving force will yield a purely periodic deflection angle $\Delta\theta$ after an initial transient. Since the motion is periodic, the mirror 10 returns to its starting position at the end of a cycle, i.e. the motion is bi-directional. Thus the mirror 10 may be scanned and returned to its starting position without unwanted vibrations.

Figure 3:
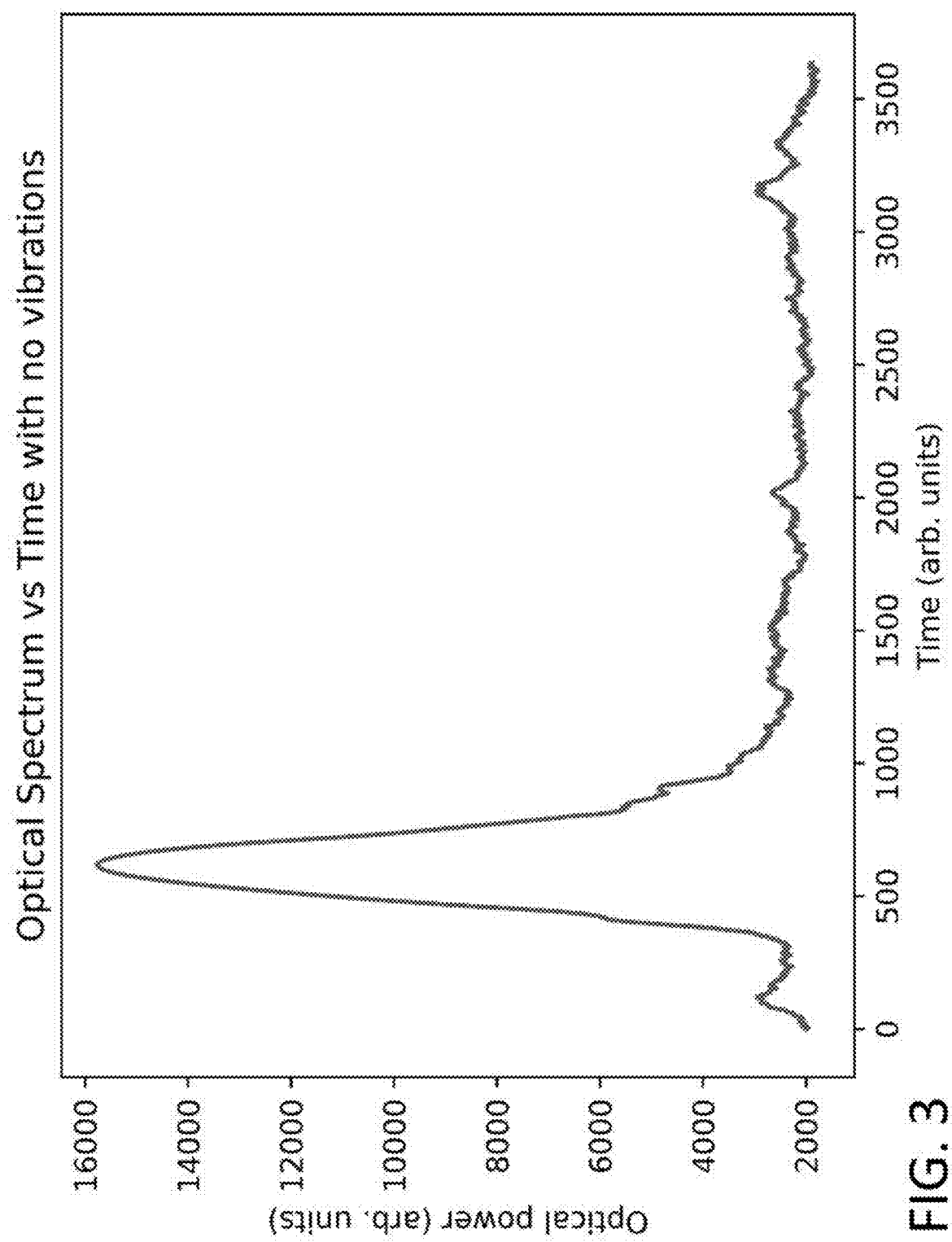
FIG. 3 is an illustration of a graphic showing a detector signal for a single frequency in regards to a MEMS driven by a periodic force after vibrations have dampened out in accordance with an aspect of the invention.

FIG. 3 shows the detector signal of the MEMS mirror spectrometer at a single frequency when driven by a periodic force, after vibrations have dampened out. The plot represents one half-cycle of the spectrometer scan. Each point in time along the x-axis corresponds to a unique angle of deflection, or mirror position. The position of the peak is uniquely related to the frequency of light incident upon the spectrometer. The spectrometer is calibrated by mapping out the relationship between frequency and mirror position.

Figure 4:
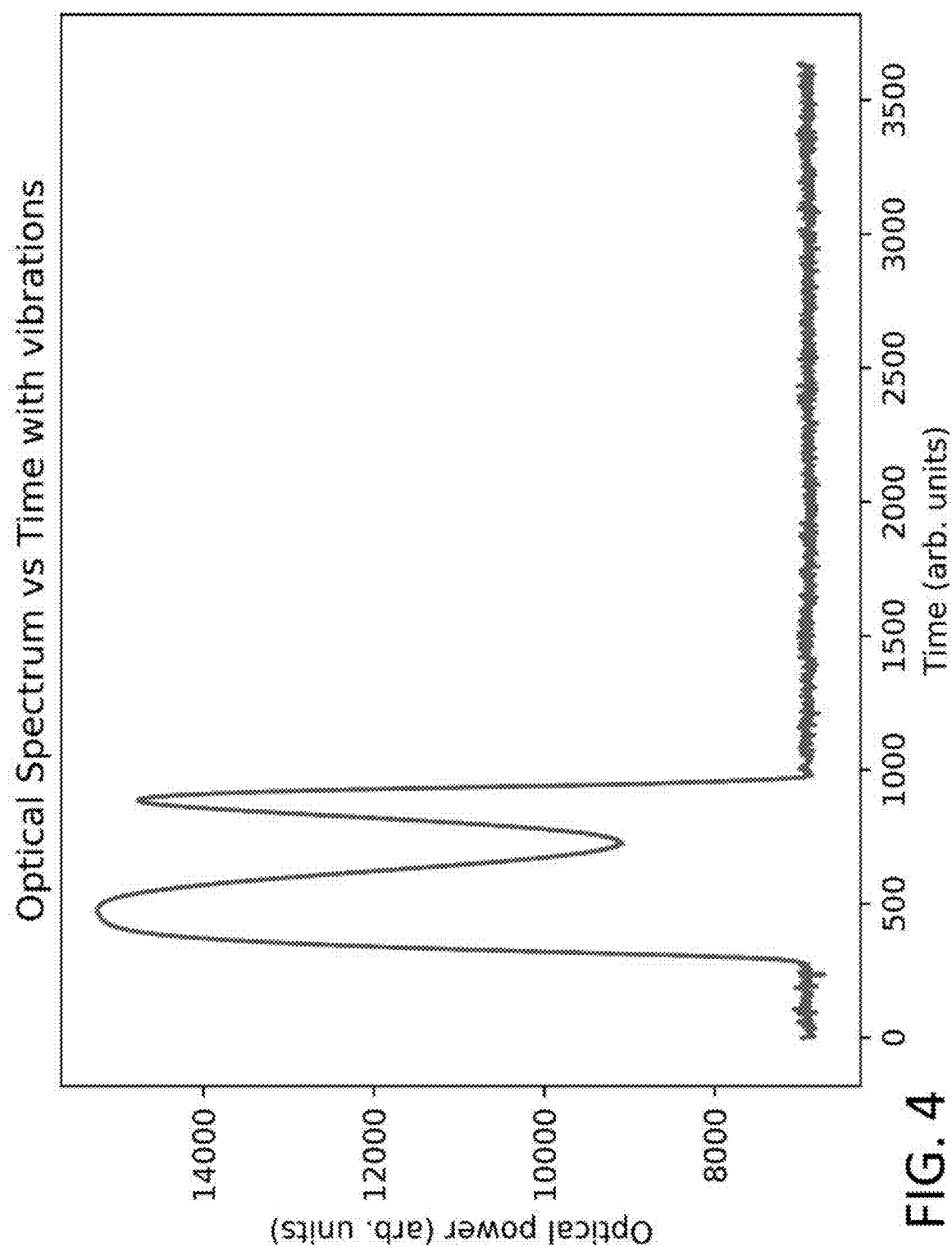
FIG. 4 is an illustration of a graphic showing a detector signal for a single frequency in regards to a MEMS driven by a periodic force before vibrations have dampened out.

FIG. 4 shows the same scan as FIG. 3, but before vibrations have dampened out. It is clear that the optical spectrum has broadened and now shows multiple peaks. This behavior occurs because mirror vibrations cause it to oscillate back and forth, resulting in the same frequency being measured multiple times over a scan. There is no longer a unique relationship between mirror position and optical frequency.

The spectrometer measures optical frequencies by creating a unique mapping between optical frequency and time (relative to the beginning of a cycle). Each point in time corresponds to a unique mirror position, which corresponds to a unique frequency. It is desirable for device performance that this relationship is linear. A linear relationship ensures uniform sensitivity for frequency measurements across the spectrum of interest and simplifies data analysis.

Figure 5:
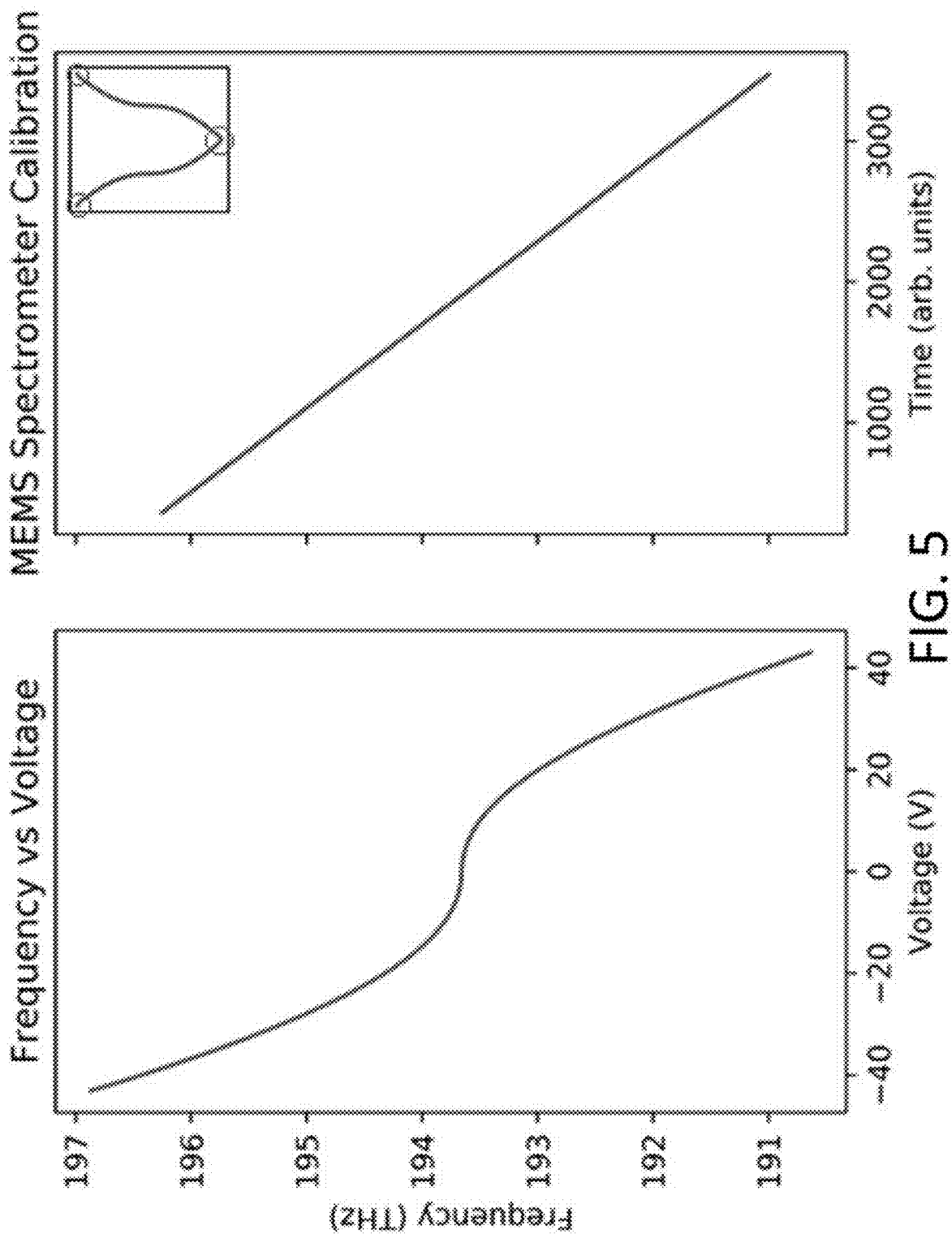
FIG. 5 is an illustration of graphics showing a MEMS mirror optical frequency vs. applied voltage (left) and a calibration curve (right) in accordance with an aspect of the invention.

FIG. 5 shows the optical frequency response vs applied voltage (left) of the MEMS spectrometer and the optical frequency response vs time when the MEMS is in motion (right). There is a non-linear relationship between the measured optical frequency and the applied voltage. When the voltage is high (either negative or positive) a small change in voltage corresponds to a large change in angle, and thus a large change in measured frequency. At voltages close to zero the angle of deflection is small, so it takes a larger change in voltage to affect the same change in frequency. Thus the spectrometer is more sensitive at higher voltages and less sensitive at smaller ones. The optical frequency measured by the spectrometer is described by the following relationship:

$$f=F(V)$$

where f is the optical frequency, V is the applied voltage, and F is the frequency-voltage curve (FIG. 5, left). To achieve a linear response over time t, the spectrometer is driven with a customized voltage waveform V(t) that ensures the spectrometer moves through a constant change in frequency at each timestep. If V(t) is equal to the inverse of the frequency-voltage curve evaluated at At+b, where A is a constant amplitude factor, and b is a constant offset factor (i.e V(t)=$F^{-1}$(At+b)), then the optical frequency vs time is a linear function:

$$f(t)=F(F^{-1}(At+b))=At+b$$

This shows that when the voltage waveform V(t) is equal to the inverse of the frequency-response curve, the resultant transfer function is linear in time. The waveform is shown in inset of FIG. 5, and is the inverse of the frequency-voltage curve stitched together so that the mirror returns to its starting position at the end of the cycle (the waveform must be periodic). Transition regions (circles) are smoothed out with cubic and quartic functions so that transient vibrations are not induced when the mirror changes direction. Although from a mathematical point of view there should be no transient vibrations as long as the force is purely periodic, non-idealities in the system will induce vibrations if there are sharp changes in the driving waveform. More specifically, the change of speed, when arriving at a turn-around point of the bi-directional rotation, means that acceleration is found in the system which may create new transient forces due to the additional force.

Figure 6:
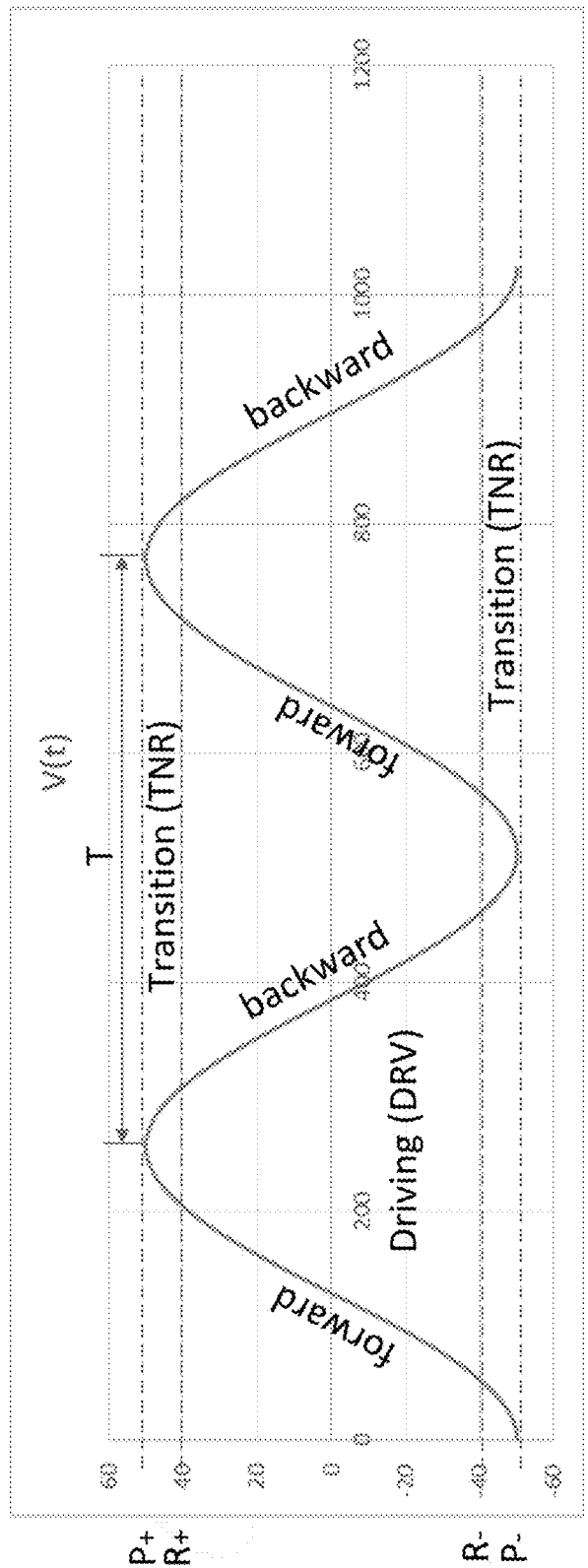
FIG. 6 is an illustration of a graphic showing a driving voltage with transition regions to a MEMS device in accordance with an aspect of the invention.

FIG. 6 shows a diagram of a driving voltage applied to a MEMS device in accordance with an aspect of the invention. The driving voltage may be divided in two parts: a driving region (DRV) and a transition region (TNR). The driving voltage may be an inverse function wherein the transition voltage may be a plurality of functions, such as parabolic, polynomial, logarithmic and exponential functions. In a specific embodiment, the period of voltage change may be of approximately 5.12 ms, the driving voltages may range from −40 to 40 V and the minimum and maximum voltages may range from −50 to 50 V. In another embodiment, the period of voltage change may be as short as 4 ms. In order to avoid transient readings, the lights and spectrum readings may be done in the driving region only. Accordingly, in an embodiment of the invention, dummy operation cycles may be applied wherein no measures are taken until transient vibrations disappear.

While illustrative and presently preferred embodiment(s) of the invention have been described in detail hereinabove, it is to be understood that the inventive concepts may be otherwise variously embodied and employed and that the appended claims are intended to be construed to include such variations except insofar as limited by the prior art.

The invention claimed is:

1. A system for driving and measuring light frequency from a MEMS mirror; the system comprising:
   a MEMS mirror comprising a reflective surface pivotable around an axis;
   a driving mean adapted to cause the MEMS mirror to pivot;
   light reflected on the reflective surface of the MEMS mirror; and
   a detector for detecting the light reflected on the MEMS mirror;
   wherein the driving mean pivots the MEMS mirror as a function of a received driving voltage after applying dummy operation cycles to the mirror until transient vibrations decay to zero.

2. The system of claim 1, the driving voltage having a periodic component.

3. The system of claim 2, the periodic component being sinusoidal.

4. The system of claim 2, the periodic component being a superposition of sinusoidal curves at different frequencies.

5. A method to measure light reflected from a moving MEMS mirror, the method comprising the steps of:
   reflecting light on a reflective surface of the MEMS mirror;
   applying a periodic force to the MEMS mirror;
   applying dummy operation cycles until transient vibrations decays to zero; and
   measuring the frequency of the light with a detector.

6. The method of claim 5, wherein the applied periodic force is sinusoidal.

7. The method of claim 5, wherein the applied periodic force is a superposition of sinusoids.

8. The method of claim 5, wherein the MEMS mirror is moving in a bi-directional motion.

9. The method of claim 8, wherein the MEMS mirror is continuously moving in a bi-directional motion.

10. The method of claim 5, wherein the periodic force is a specialized waveform based on MEMS calibration data.

11. The method of claim 10, wherein the MEMS calibration data is a function of the periodic force frequency relative to the MEMS mirror position.

12. The method of claim 10, wherein the specialized waveform comprises a linear transfer function for driving the MEMS mirror.

13. The method of claim 10, the periodic force further comprising transition functions at top and bottom regions of the specialized waveform.

14. The method of claim 12, wherein said transition functions are any one of parabolic, polynomial, logarithmic and exponential functions.

15. A method to measure light reflected from a moving MEMS mirror, the method comprising the steps of:
   reflecting light on the MEMS mirror;
   applying a sinusoidal periodic force to the MEMS mirror to move said MEMS mirror in a continuous bi-directional motion around a pivot point, the sinusoidal periodic force being a specialized waveform comprising transition functions at the top and bottom regions of said specialized waveform;
   applying dummy operation cycles until transient vibrations decay to zero; and
   measuring the frequency of the light with a detector.

16. The method of claim 15, wherein the specialized waveform is based on MEMS calibration data that is a function of the frequency relative to the MEMS mirror position.

17. The method of claim 15, wherein the specialized waveform ensures a linear transfer function for driving the MEMS mirror.

18. The method of claim 15, wherein said transition functions are any one of parabolic, polynomial, logarithmic or exponential functions.

* * * * *